(12) United States Patent
Houston et al.

(10) Patent No.: US 6,873,008 B2
(45) Date of Patent: Mar. 29, 2005

(54) ASYMMETRICAL DEVICES FOR SHORT GATE LENGTH PERFORMANCE WITH DISPOSABLE SIDEWALL

(75) Inventors: Theodore W. Houston, Richardson, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/682,729

(22) Filed: Oct. 10, 2003

(65) Prior Publication Data

US 2004/0077138 A1 Apr. 22, 2004

Related U.S. Application Data

(62) Division of application No. 10/054,957, filed on Jan. 25, 2002, which is a division of application No. 09/368,387, filed on Aug. 4, 1999, now Pat. No. 6,548,359.
(60) Provisional application No. 60/095,327, filed on Aug. 4, 1998.

(51) Int. Cl.$^7$ .............................................. H01L 29/76
(52) U.S. Cl. ...................... 257/327; 257/335; 257/345; 257/376; 257/404; 438/217; 438/289; 438/290; 438/291
(58) Field of Search ................................. 257/335, 336, 257/345, 376, 404, 327; 438/217, 289, 290, 291

(56) References Cited

U.S. PATENT DOCUMENTS

| | | | | |
|---|---|---|---|---|
| 4,276,095 A | * | 6/1981 | Beilstein et al. | 438/289 |
| 4,371,955 A | | 2/1983 | Sasaki | 365/185 |
| 4,948,745 A | | 8/1990 | Pfiester et al. | 437/41 |
| 5,244,823 A | | 9/1993 | Adan | 437/41 |
| 5,374,574 A | | 12/1994 | Kwon | 437/44 |
| 5,401,987 A | * | 3/1995 | Hiser et al. | 257/204 |
| 5,422,505 A | | 6/1995 | Shirai | 257/327 |
| 5,532,175 A | | 7/1996 | Racanelli et al. | 437/29 |
| 5,548,148 A | * | 8/1996 | Bindal | 257/335 |
| 5,736,446 A | * | 4/1998 | Wu | 438/305 |
| 5,753,958 A | * | 5/1998 | Burr et al. | 257/392 |
| 5,766,969 A | | 6/1998 | Fulford, Jr. et al. | 437/44 |
| 5,789,778 A | * | 8/1998 | Murai | 257/325 |
| 5,804,497 A | | 9/1998 | Gardner et al. | 438/529 |
| 5,843,825 A | * | 12/1998 | Hwang | 438/291 |
| 5,858,848 A | | 1/1999 | Gardner et al. | 438/305 |
| 5,892,707 A | * | 4/1999 | Noble | 365/149 |
| 5,956,588 A | * | 9/1999 | Choi et al. | 438/286 |
| 6,096,586 A | * | 8/2000 | Milic-Strkalj et al. | 438/174 |
| 6,146,953 A | * | 11/2000 | Lee et al. | 438/289 |
| 6,228,725 B1 | | 5/2001 | Nandakumar et al. | 438/289 |
| 6,373,102 B1 | | 4/2002 | Huang | 257/345 |
| 6,482,724 B1 | * | 11/2002 | Chatterjee | 438/525 |

OTHER PUBLICATIONS

G. G. Shahidi et al. "Indium Channel Imlant for Improved Short–Channel Behavior of Submicrometer NMOSFETs", IEEE 1993, pp 409–411.

* cited by examiner

Primary Examiner—Mary Wilczewski
Assistant Examiner—Toniae M. Thomas
(74) Attorney, Agent, or Firm—Wade James Brady, III; Frederick J. Telecky, Jr.

(57) ABSTRACT

An asymmetrical channel implant from source to drain improves short channel characteristics. The implant provides a relatively high $V_T$ net dopant adjacent to the source region and a relatively low $V_T$ net dopant in the remainder of the channel region. One way to achieve this arrangement with disposable gate processing is to add disposable sidewalls inside the gate opening (after removing the disposable gate), patterning to selectively remove the source or gate side sidewalls, implant the source and drain regions and remove the remaining sidewall and the proceed. According to a second embodiment, wherein the channel implant can be symmetrical, a relatively low net $V_T$ implant is provided in the central region of the channel and a relatively high net $V_T$ implant is provided in the channel regions adjacent to the source and drain regions.

2 Claims, 2 Drawing Sheets

ASYMMETRICAL DEVICES FOR SHORT GATE LENGTH PERFORMANCE WITH DISPOSABLE SIDEWALL

This application is a division of Ser. No. 10/054,957 filed Jan. 25, 2002, which is a division of Ser. No. 09/368,387, filed Aug. 4, 1999, now U.S. Pat. No. 6,548,359, which claims priority under 35 U.S.C. 119 based upon Provisional Application Ser. No. 60/095,327, filed Aug. 4, 1998.

BACKGROUND OF THE INVENTION

1. Field of the Invention

This invention relates to a field effect transistor (FET) with an implant within the gate length of the FET and a method of making the FET.

2. Brief Description of the Prior Art

It has been found that there are advantages for an FET to have an implant in the channel region that does not extend from the source to the drain and is aligned to the gate edge. For example, a pocket implant can be used to reduce short channel length effects. Yet, it can be undesirable to have a pocket implant extend into the source/drain (S/D) area because of resulting increased junction capacitance. It has also been found that there are advantages for an FET to have a region of controlling $V_T$ on the source side of the channel with a more conductive $V_T$ on the drain side. The short effective channel length and low source resistance of such an FET results in increased drive current and the reduced influence of the drain provides superior short channel characteristics. In the prior art, angled implants and lateral diffusions have been used to obtain channel impurity profiles self-aligned to the gate edge. However, these approaches have disadvantages resulting from restrictions in the channel implant profiles that can be obtained and from the interdependence of the channel profile and the S/D extension profiles. It is therefore apparent that transistors having an independent channel implant region that is self aligned to the S/D edge is highly desirable.

SUMMARY OF THE INVENTION

In accordance with the present invention, there is provided a technique for fabrication of FET devices having a well controlled implant region between the two source/drain regions, self aligned to the S/D edge as well as the FET itself. In one embodiment, this implant region is used to create a controlling $V_T$ region of shorter effective length than the S/D spacing. Preferably, the controlling $V_T$ region is on the source side of the space between source and drain. In a second embodiment, the implant region is a pocket implant with limited extension into the S/D region. In a third embodiment, the implant is a S/D extension implant with extension into the channel region being independent of the diffusion of the S/D implant. The term "controlling $V_T$ region" as used herein refers to that region which is the least conducting region and thus controls the current flow. For an n-channel transistor, this will generally be the more positive (higher) $V_T$. The controlling region could have a positive $V_T$ and the rest of the channel could have a negative $V_T$, or the controlling region could have a negative $V_T$ with the rest of the channel having a more negative $V_T$. The same applies for p-channel transistors except for a polarity reversal.

In accordance with the present invention, there is provided a fabrication technique for fabrication of FET devices having a well controlled sub-lithographic effective gate length, independent of gate orientation. The shorter effective channel length provides increased drive current since drive current is inversely proportional to channel length. The shorter effective channel length is achieved without requiring that the physical gate also be as short as the effective channel length. This provides superior short gate length device characteristics and avoids the problems inherent in requiring the shorter gate length during fabrication of the device.

One way to achieve the effective short channel is to use a disposable gate process with masked/disposable sidewalls. This is accomplished by providing a doped substrate having spaced apart source/drain regions with a pad oxide and a patterned mask over the source/drain regions, preferably of silicon nitride, leaving the gate region exposed after disposal of the disposable gate. A removable sidewall is formed on the mask, preferably with silicon nitride, and the remaining gate region between the disposable sidewalls is filled with silicon dioxide with the surface then being planarized, preferably with a chemical mechanical polish (CMP). The sidewall adjacent to the source region is then removed by depositing and patterning a resist over the planarized surface and etching. A high $V_T$ implant is then performed through the space from which the sidewall was removed to dope the channel region adjacent to the source region. The remaining sidewall is then removed. This is followed by a low $V_T$ implant in the channel region between the source and drain regions. It should be understood that the high $V_T$ implant can be a counter doping of the low $V_T$ implant with appropriate masking to perform the implants in this manner. The result is an effective channel length, L, which is independent of the original disposable gate length. Fabrication then proceeds in standard manner to complete the device.

As a second embodiment, the low $V_T$ channel implant can be performed initially after removal of the disposable gate and formation of disposable sidewalls on the mask as in the first embodiment, the sidewall on the source side is retained and the sidewall on the drain side is removed with appropriate deposition and patterning of resist and etching. A low $V_T$ is then provided into the exposed portion of the channel. The remaining sidewall at the source end of the channel is then removed and a high $V_T$ implant is then provided of opposite conductivity type to the low $V_T$ implant to provide the same result as in the first embodiment. Fabrication then proceeds in standard manner to complete the device.

As a third embodiment, it is desirable to add a liner over the mask surface, sidewalls and pad oxide prior to fabrication as noted above with reference to the first and second embodiments. The liner is preferably silicon nitride. The liner aids etch selectivity and protects the surface of the silicon when performing the implants.

As a fourth embodiment, the FET can be made symmetrical rather than asymmetrical as described in the first and second embodiments with a different implant in the center of the channel region relative to the source and drain ends of the channel region. An implant can be performed following sidewall formation. The sidewalls would then be removed and the entire channel region would be doped n- or p-type to provide either a less heavily net doped region adjacent the source and drain regions if the same conductivity type dopant is used or a more heavily net doped region adjacent the source and drain if the opposite conductivity type dopant is used. The resist pattern used to mask removal of selected sidewalls can also distinguish n- and p-channel transistors for different $V_T$ implants. Optionally, an implant can be performed before formation of the sidewalls, followed by an implant after formation of the sidewalls. For this option, the sidewall can be left in place for formation of the actual gate.

DESCRIPTION OF THE PREFERRED EMBODIMENT

Figure 1A:
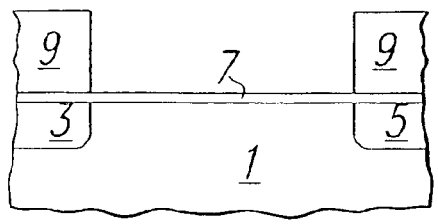
FIGS. 1A to 1D represent a process flow for formation of an asymmetrical FET device for short gate length performance in accordance with a first embodiment of the present invention.
Figure 1B:
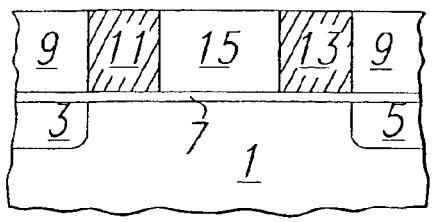
Figure 1C:
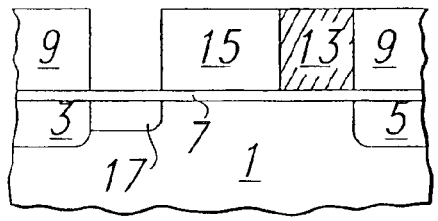
Figure 1D:
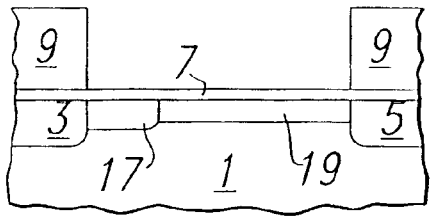

In accordance with a first embodiment of the invention, the effective short channel is achieved by using a disposable gate process with masked/disposable sidewalls as shown in FIGS. 1A to 1D. For an n-channel device (it is understood that all conductivity types will be opposite for a p-channel device), there is provided a p-doped substrate 1 having spaced apart source/drain regions 3, 5 with a pad oxide 7 over the substrate and a patterned silicon nitride mask 9 over the source/drain regions. This arrangement is provided, leaving the gate region exposed after prior disposal of the disposable gate in standard manner as shown in FIG. 1A. A removable polysilicon sidewall 11, 13 is formed on each side of the nitride mask 9 and the remaining gate region between the disposable sidewalls is filled with silicon dioxide 15 with the surface then being planarized, preferably with a chemical mechanical polish (CMP) as shown if FIG. 1B. The sidewall 11 adjacent what will ultimately be the source region is then removed by depositing and patterning a resist over the planarized surface and etching in standard manner. A high $V_T$ implant is then performed through the space from which the sidewall was removed to dope the channel region 17 adjacent to the source region 3 as shown in FIG. 1C and the silicon dioxide 15 and remaining sidewall 13 are then removed. This is followed by a low $V_T$ implant in the channel region between the source and drain regions to leave the high $V_T$ region 17 adjacent to the source region 3 and a low $V_T$ region 19 adjacent to the drain region 5 as shown in FIG. 1D. Optionally, the low $V_T$ implant can be performed before formation of the sidewalls.

It should be understood that the $V_T$ of region 17 is a result of the combination of what has been referred to as the high $V_T$ and the low $V_T$ implant. One can be a counter-doping of the other. The result is an effective channel length, L, which is independent of the original disposable gate length. Fabrication then proceeds in standard manner to complete the device.

Figure 2A:
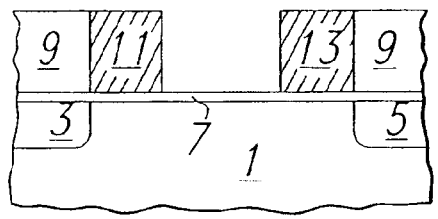
FIGS. 2A to 2C represent a process flow for formation of an asymmetrical FET device for short gate length performance in accordance with a second embodiment of the present invention.
Figure 2B:
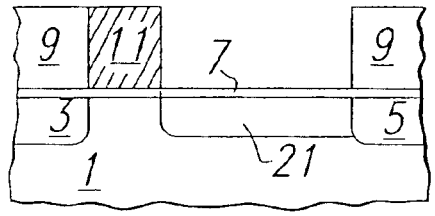
Figure 2C:
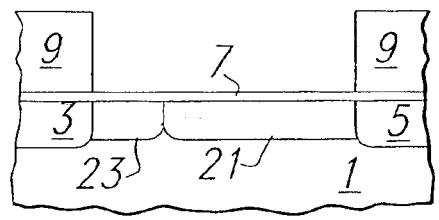

As a second embodiment, the low $V_T$ channel implant can be performed prior to the high $V_T$ implant. After removal of the disposable gate, disposable sidewalls are formed on the mask as in FIG. 1B of the first embodiment and as shown in FIG. 2A wherein like reference characters refer to the same or similar structure. The sidewall on the source region side 11 is retained and the sidewall on the drain region side 13 is removed with appropriate deposition and patterning of resist and etching in standard manner. A low $V_T$ implant is then provided into the exposed portion 21 of the channel as shown in FIG. 2B. The remaining sidewall 11 at the source end of the channel is then removed and a high $V_T$ implant is implanted into the channel region between the source and drain regions. Preferably, the high $V_T$ implant is of opposite conductivity type to the low $V_T$ implant to provide a high $V_T$ region 23 and a low $V_T$ region 21. Fabrication then proceeds in standard manner to complete the device. Optionally, the high $V_T$ implant can be performed prior to formation of the sidewalls.

Figure 3A:
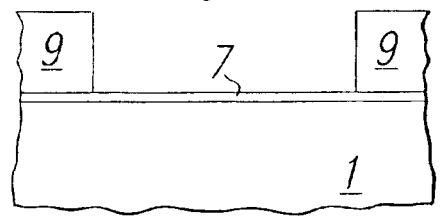
FIG. 3 shows a step in the process flow in accordance with a third embodiment of the present invention.
Figure 3B:
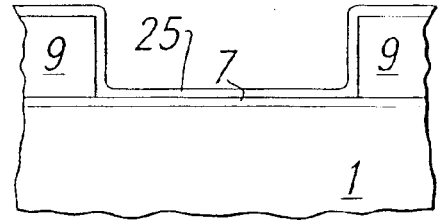
Figure 3C:
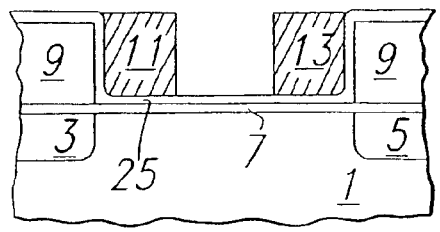

As a third embodiment, it is desirable to add a liner 25 over the mask surface, sidewalls and pad oxide prior to fabrication as noted above with reference to the first and/or second embodiments and particularly over the structure as shown in FIG. 1A and the structure as shown in FIG. 2A prior to formation of the sidewalls 11, 13 with subsequent formation of the sidewalls 11, 13 over the liner as shown in FIG. 3. The liner 25 is preferably silicon nitride. Fabrication then proceeds as in the prior embodiments as discussed above.

Figure 4A:
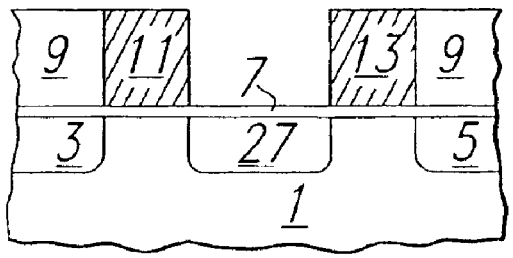
FIGS. 4A and 4B show a process flow for formation of a symmetrical FET device for short gate length performance in accordance with a fourth embodiment of the present invention.
Figure 4B:
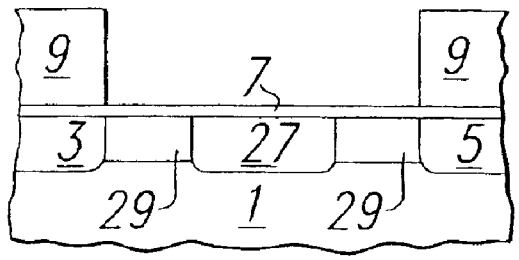

As a fourth embodiment as shown if FIGS. 4A and 4B, the FET can be made in a symmetrical rather than asymmetrical embodiment as described in the first and second embodiments with a different implant 27 in the center of the channel region as shown in FIG. 4A. Optionally, implant 27 may include a punch-through implant. The sidewalls 11, 13 are then removed and the entire channel region is doped wither n- or p-type to provide either a less heavily net doped region adjacent the source and drain regions 29 if the same conductivity type dopant is used or a more heavily net doped region adjacent the source and drain regions if the opposite conductivity type dopant is used and the opposite characteristic in region 27 as shown in FIG. 4B. Optionally, the implant in the full channel region can be performed prior to sidewall formation. Fabrication then proceeds in standard manner to complete the device.

Figure 5A:
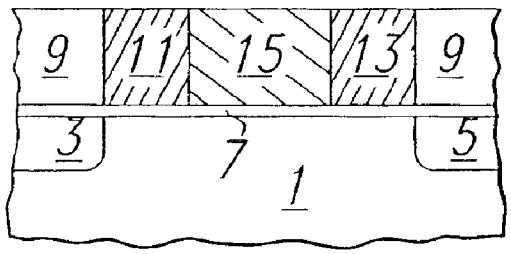
FIGS. 5A to 5C show a process flow for formation of an FET in accordance with a fifth embodiment of the present invention.
Figure 5B:
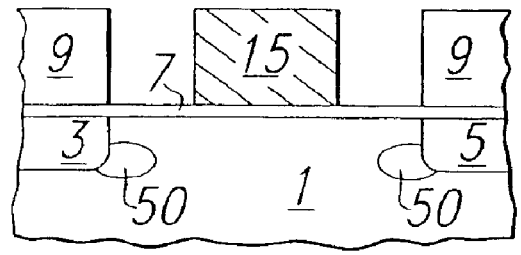
Figure 5C:
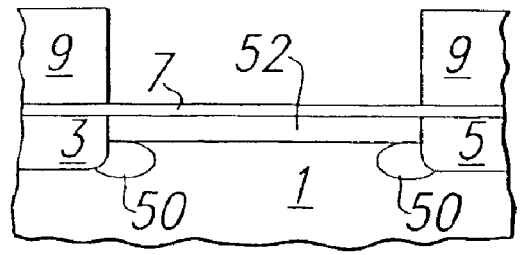

As a fifth embodiment as shown in FIGS. 5A to 5C, the FET can be made symmetrical with the implant in the channel regions adjacent to the source and drain being performed prior to the implant in the central region. As in the first embodiment, sidewalls 11 and 13 are formed and the central region 15 is filled and planarized as shown in FIG. 5A. Sidewalls 11 and 13 are then removed and an implant is performed into regions 50. As depicted in FIG. 5B, the implant regions 50 may be pocket implants. Optionally, source/drain extension or $V_T$ adjust implants can be performed at this time. Center masking material 15 is then removed and in implant is performed into the channel region 52 between the source and drain regions.

Figure 6A:
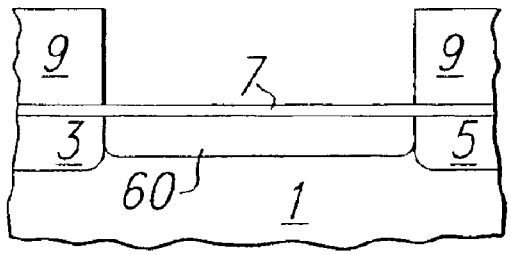
FIGS. 6A and 6B show a process flow for formation of an FET in accordance with a sixth embodiment of the present invention.
Figure 6B:
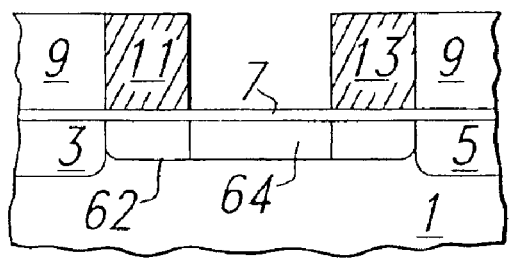

As a sixth embodiment, the sidewalls are left in place, reducing the physical gate length, as shown in FIGS. 6A and 6B. An implant is performed in the full channel region 60 prior to formation of the sidewalls. A second implant is performed into region 64 after formation of the sidewalls, resulting in a different implant profile in regions 62 versus region 64. Sidewalls 11 and 13 can then be left in place as formation of the gate proceeds in normal fashion. Optionally, sidewall 11 or sidewall 13 can be removed with appropriate pattern and etch steps prior to or subsequent to the implant to region 64.

Optionally, the sidewall material can be of the same material as the masking material and left in place or removed with a timed isotropic etch prior to gate formation.

Though the invention has been described with reference to specific preferred embodiments thereof, many variations and modifications will immediately become apparent to those skilled in the art. For example, the opening for the damascene gate can be made by a trench etch into the masking material rather than by removal of a disposable gate. Various materials or stacks of materials can be used for the masking material, the sidewalls, and the fill material. The source/drain implants can be performed after the actual gate formation rather than with the disposable gate, and the edge of the source/drain implant relative to the opening for the damascene gate can vary from that shown, and a source/drain extension may be used. The implants into the various regions encompassed by the gate opening can include but are not restricted to threshold adjustment implants, source/drain extension implants, pocket implants and punch through implants. Multiple implants of different species or energy can be performed in any of the regions to obtain the desired doping profile. The depth of implants illustrated is not intended to be restrictive. Different sequences of sidewall formation, sidewall removal, and implantation, including multiple sidewall formation can be used. Sidewalls can be added after completion of the channel region implants to adjust the physical gate length. It is therefore the intention that the appended claims be interpreted as broadly as possible in view of the prior art to include all such variations and modification.

What is claimed is:

1. A transistor which comprises:
   (a) a semiconductor substrate having a surface and having a first source/drain region and a second source/drain region spaced apart from each other and extending to said surface; and
   (b) a channel region disposed in said substrate between said first and second source/drain regions in said substrate and extending to said surface, said channel region having a first dopant profile contacting said first source/drain region to provide a first $V_T$ and a second dopant profile different from said first dopant profile contacting said second source/drain region to provide a second $V_T$ different from said first $V_T$;
   wherein said first source/drain region is a source region, said second source/drain region is a drain region and wherein said first $V_T$ is higher than said second $V_T$.

2. The transistor of claim 1 wherein said first dopant profile is a relatively low $V_T$ dopant implant and said second dopant profile is a selective relatively high $V_T$ dopant implant.

* * * * *